United States Patent [19]

Sato

[11] Patent Number: 4,783,343
[45] Date of Patent: Nov. 8, 1988

[54] METHOD FOR SUPPLYING METAL ORGANIC GAS AND AN APPARATUS FOR REALIZING SAME

[75] Inventor: Kazuo Sato, Tokyo, Japan

[73] Assignee: Clarion Co., Ltd., Tokyo, Japan

[21] Appl. No.: 52,241

[22] Filed: May 19, 1987

[30] Foreign Application Priority Data

May 21, 1986 [JP] Japan ................. 61-116913

[51] Int. Cl.$^4$ ............................. C23C 16/52
[52] U.S. Cl. .................... 427/8; 427/248.1; 118/692; 118/726; 261/DIG. 65
[58] Field of Search ............ 118/692, 726; 427/8, 427/248.1; 261/DIG. 65

[56] References Cited

U.S. PATENT DOCUMENTS

| | | | |
|---|---|---|---|
| 4,436,674 | 3/1984 | McMenamin | 261/64.5 |
| 4,488,506 | 12/1984 | Heinecke | 118/726 |
| 4,545,801 | 10/1985 | Miyajiri | 118/726 |
| 4,619,844 | 10/1986 | Pierce | 118/692 |
| 4,640,221 | 2/1987 | Barbee | 118/692 |
| 4,683,143 | 7/1987 | Riley | 118/692 |

Primary Examiner—Richard Bueker
Attorney, Agent, or Firm—Wallenstein, Wagner, Hattis & Strampel, Ltd.

[57] ABSTRACT

In a reduced pressure gaseous phase thin film growth device, in which the pressure within a bubbler is detected during bubbling of an organo-metallic compound and depending on the pressure thus detected, a pressure difference valve disposed between a pipe for introducing trimethylaluminium gas and a reduced pressure reactor is controlled so that the pressure within the bubbler is kept to be constant.

6 Claims, 7 Drawing Sheets

4,783,343

METHOD FOR SUPPLYING METAL ORGANIC GAS AND AN APPARATUS FOR REALIZING SAME

FIELD OF THE INVENTION

This invention relates to a method for supplying metal organic gas in a reduced pressure gaseous phase thin film growth device using organic metal and an apparatus for realizing same.

BACKGROUND OF THE INVENTION

Since the metal organic chemical vapor deposition (hereinbelow abbreviated to MOCVD) method, which is a thin film growth method using metal organic material, is excellent in mass productivity and controllability as a method for growing compound semiconductor thin film, etc., has been widely utilized. By the reduced pressure MOCVD method, by which thin film is grown in a reactor with a reduced pressure, among others, since gaseous phase nucleus formation, which is a problem to be solved for the atmospheric pressure method, is small, the quality and the uniformity of the thin film are improved. Therefore recently research and practical use thereof have been extensively carried out.

In the case where e.g. III - V compound is grown by this reduced pressure MOCVD method, it is usual to use organic metal as III group material and hydride as V group material. More concretely speaking, in the case where an AlN film is grown, TMA (trimethylaluminium) is used as III group material and $NH_3$ as V group material. Introduction of TMA into the reactor for the thin film growth is effected by introducing carrier gas such as $H_2$ into TMA (which is liquid at the room temperature) while effecting bubbling. In this way TMA gas corresponding to the saturated vapor pressure at the bubbler temperature is introduced by the carrier gas into the reactor.

Representing the flow rate of the carrier gas in mol by $Q_c$ (mol/min), the flow rate of TMA gas by $Q_{TMA}$, the pressure within the bubbler by $P_b$ (Torr), and the saturated vapor pressure of TMA at the bubbler temperature $T_b$ by $P_{TMA}$ (Torr), the flow rate of TMA gas in mol $Q_{TMA}$ can be given by the following equation;

$$Q_{TMA} = Q_c \times \frac{P_{TMA}}{P_b - P_{TMA}} \quad (1)$$

FIG. 7 illustrates the construction of the metal organic gas supplier in an atmospheric pressure type MOCVD device. In the figure reference numeral 1 indicates a bubbler made of stainless steel, 2 organic metal (TMA), 3 a stop valve disposed at the inlet of the bubbler, 4 a stop valve disposed at the outlet of the bubbler, 5 a bypass valve, 6 a mass flow meter, 7 a flow path, 8 a reactor, 9 a substrate and 10 a thermostat.

The flow rate of the carrier gas can be controlled usually with a high precision by means of the mass flow meter 6, etc. Further, since the temperature regulation of the bubbler 1 and the organic metal (liquid) 2 can be controlled with a high precision by means of the thermostat 10, $P_{TMA}$ can be also regulated easily. Since the pressure in the reactor 9 is 1 atm (760 Torr), the pressure in the bubbler 1 is higher than that in the reactor by the pressure loss in the flow path 7 between the reactor 8 and the bubbler 1. However, at the flow rate of the carrier gas usually used (several hundreds ~ several thousands cc/min) the pressure loss in the flow path 7 of the vapor between the reactor 8 and the bubbler 1 is negligibly small. Consequently the pressure in the bubbler 1 is approximately equal to the pressure in the reactor 8, which remains always to be 1 atm. As it is clear from Eq. (1), $Q_{TMA}$ can be stabilized relatively easily by the atmospheric pressure CVD method. FIG. 8 indicates the pressure distribution within an atmospheric pressure MOCVD device.

On the contrary, FIG. 9 represents the construction of an apparatus according to the reduced pressure method. In the figure the reference numerals, which are used in common in FIG. 7, represent items identical or corresponding to those indicated in FIG. 7 and 11 indicates a pressure difference generator. FIG. 10 is a graph indicating the pressure distribution within an reduced pressure MOCVD device, which corresponds to that indicated in FIG. 8.

It differs from the atmospheric pressure method in that a pressure difference generator 11 is disposed between the reactor 8 and the bubbler 1. Usually a variable needle valve is used as the pressure difference generator 11. Representing the pressure in the reactor by $P_6$, the bubbler pressure $P_3$ can be given as follows;

$$P_3 = P_6 + (P_5 - P_6) + (P_4 - P_5) + (P_3 - P_4)$$

At the usual flow rate, since the pressure losses $(P_3 - P_4)$ and $(P_5 - P_6)$ are very small with respect to $(P_4 - P_5)$, the following equation is valid;

$$P_3 \approx 6 + (P_4 - P_5) \quad (2)$$

and the reactor pressure 6 can be represented by $$P_6 = Q_t / S_r$$

in which $Q_t$ indicates the total flow rate of the gas flowing in the reactor and $S_r$ the effective evacuation speed at the outlet of the reactor. $Q_t$ can be stabilized by controlling the gas flow rate by means of a mass flow meter. Further $S_r$ can be stabilized by using a vacuum pump whose fluctuations in the evacuation speed are small. Consequently the value of $P_6$ can be considered usually to be stable. Therefore it can be understood from Eq. (2) that it is the pressure loss $(P_4 - P_5)$ in the pressure difference generator portion that influences most strongly on $P_3 (=P_6)$.

When the conductance in the pressure difference generator portion 11 is kept constant (the opening ratio of the needle valve is constant), $(P_4 - P_5)$ varies, depending on the viscosity, the flow speed, the specific weight, etc. of the fluid. Consequently, in the case where the fluid flowing through the pressure difference generator portion changes, when the viscosity and the specific weight vary considerably from those before the change, $(P_4 - P_5)$ varies at the same time. Variations in $(P_4 - P_5)$ provoke variations in $P_3 (=P_6)$ and thus the value of $Q_{TMA}$ given by Eq. (1) varies also. Due to this fact the predetermined growth speed can be obtained no more and the controllability is worsened.

The operation for growing thin film will be explained by taking FIG. 9 as an example. At first carrier gas is supplied through the bypass valve 5, the pipe 7 and the pressure difference generator portion 11 to the reactor 8 with a predetermined flow rate by means of the mass flow meter. At this time the pressure difference generator portion 11 is so regulated that the pressure in the bubbler 1 is 1 atm ($\approx$760 Torr). The pressure distribution when a stationary state is obtained in this way is indicated by a full line in FIG. 10. During this operation the valves 3 and 4 are closed.

Next the valve 5 is closed and the valves 3 and 4 are opened one after another. In this way carrier gas is introduced into the bubbler 1 and the bubbling of TMA begins. Vaporized TMA gas is led through the flow path 7 and the pressure difference generator 11 to the reactor 8. At this time, since the gas passing through the pressure difference generator portion 11 changes from H$_2$100% to a mixture gas of H$_2$ and TMA, remarkable variations in the viscosity and the specific weight of the gas are produced. It is also conceivable that TMA is adsorbed by the inner surface of the pipe and the pressure loss in the pressure difference generator portion 11 varies also. The concentration of TMA in the bubbler is usually about 1%, but the density thereof is more than 70 times as great as H$_2$. Since the pressure loss $\Delta P$ in the pressure difference generator portion 11 can be represented by $$\Delta P = (P_4 - P_5) \propto \rho$$

in which $\rho$ indicates the density, even if the concentration of TMA in the mixture gas passing through the flow path is only about 1%, increase in the pressure difference $\Delta P = (P_4 - P_5)$ cannot be neglected. As the result, since $P_3$ ($=P_6$) increases also, the flow rate of TMA in mol (effective supplied amount) decreases, as it is understood from Eq. (1).

Variations in the pressure can be produced by other factors and the pressure in the bubbler can be negative. However, in any case, in order to stabilize the supplied amount of TMA, it is necessary to stabilize $P_3$ ($=P_6$).

FIG. 11 shows variations in the flow rate of organic metal (TMA) produced by the prior art reduced pressure MOCVD method in mol with the passage of time. It can be seen that the flow rate of TMA in mol have not the expected value, because of the fact that the pressure in the bubbler differs before and after TMA begins to flow (FIG. 12).

The pressure loss ($\Delta P$) in the flow path is influenced remarkably by the flow speed (v), i.e.

$$\Delta P \propto V^2.$$

Consequently even slight variations in the flow rate (and thus the flow speed) of the carrier gas produce large variations in the pressure loss in the pressure difference generator portion 11.

For the multi-layer growth of mixt crystal semiconductors such as Ga$_{1-x}$Al$_x$As, since the growth rate differs for every layer, it is necessary to vary the ratio of the supplied materials Al and Ga with the growth of every layer. In this case, for the atmospheric pressure system, since the bubbling pressure of the organic metal is constant ($=760$ Torr) independently of the flow rate, the control of x is effected simply by varying the ratio of the flow rate of the carrier gas. On the contrary, for the reduced pressure system, since variations in the flow rate provoke variations in the pressure loss in the pressure difference generator portion and thus variations in the bubbling pressure, according to the prior art techniques it was difficult to control the flow rate in mol of the organic metal with a high precision.

As explained above, according to the prior art reduced pressure method, since it was not taken into account that the pressure loss in the pressure difference generator portion 11 depends on the kind of the gas flowing therethrough, unstable variations in the pressure within the bubbler 1 were produced and the controllability of the organic gas supply was bad. Since originally by the MOCVD method the rate is determined by the transportation of material, the method has a great advantage that the growth speed is determined only by the flow rate of the organic gas and thus it is a method, which is excellent in the mass productivity and the controllability. However, under a reduced pressure, heretofore, since the MOCVD method had a problematical point that the pressure in the bubbler 1 fluctuated, there was a drawback that its advantage was not utilized sufficiently.

In addition the measurement of Q$_{TMA}$ was effected by mass-analyzing gas sampled from the reactor.

OBJECT OF THE INVENTION

The object of this invention is to provide a method for supplying metal organic gas and an apparatus for realizing same permitting thin film growth, which is excellent both in the controllability and in the reproducibility.

SUMMARY OF THE INVENTION

In order to achieve the above object, the method for supplying metal organic gas according to this invention is characterized in that the pressure within the bubbler is detected and a pressure difference valve is controlled on the basis of the pressure thus detected so that the pressure within the bubbler is constant.

In order to realize the method described above, an apparatus for supplying metal organic gas according to this invention consists of a pressure sensor for detecting the pressure within the bubbler, reference pressure signal generator means, a comparator comparing the output of the pressure sensor with the output of the reference pressure signal generator means, and a controllable pressure difference valve working depending on the output of the comparator.

The inventor of this invention has found that factors causing the flow rate of the metal organic gas in mol to fluctuate instably in a reduced pressure MOCVD device were variations in the pressure within the bubbler. The governing factor provoking these variations in the pressure is the variation in the pressure loss produced in the pressure difference generator portion. Since the pressure loss produced in the pressure difference generator is influenced considerably by the flow rate, the specific weight, the viscosity, etc. of carrier gas, if they vary during a process, the pressure loss in the pressure difference generator portion varies, which provokes as a result variations in the bubbler pressure, i.e. variations in the flow rate of TMA in mol. Therefore the inventor of this invention has conceived a method for stabilizing the bubbler pressure by controlling the pressure loss in the pressure difference generator portion as a method for intending to stabilize the flow rate of the metal organic gas (TMA). That is, by the method for supplying metal organic gas according to this invention there is disposed a pressure meter for monitoring the pressure within the bubbler, its output signal is compared with a reference pressure signal corresponding to a set bubbler pressure, and the conductance of the pressure difference generator is varied so that the two signals are in accordance with each other.

These and other objects and advantages of the present invention will become apparent by reference to the following description and drawings.

DETAILED DESCRIPTION

Figure 1:
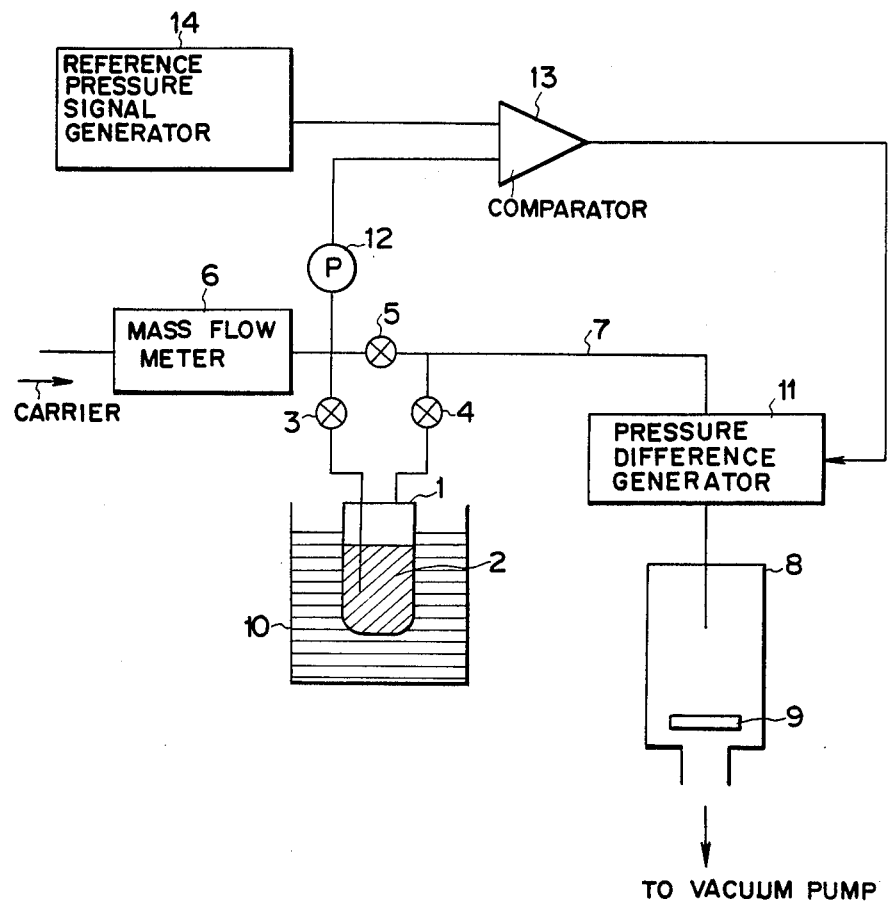
FIG. 1 is a block diagram illustrating the construction of a reduced MOCVD device provided with an apparatus for supplying metal organic gas according to this invention.
Figure 9:
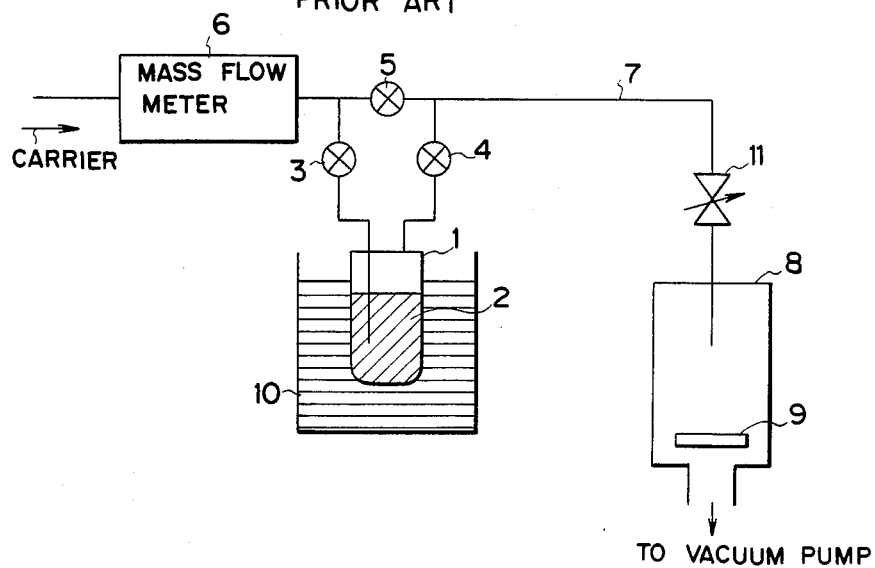
FIG. 9 is a block diagram illustrating the construction of a portion for supplying metal organic gas in a reduced pressure type MOCVD device.
Figure 10:
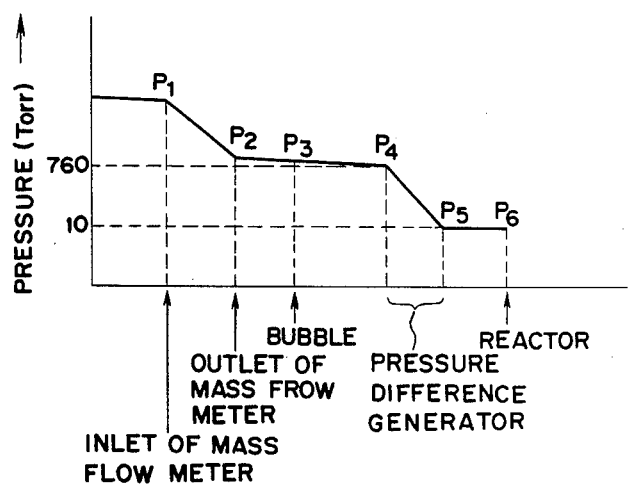
FIG. 10 is a graph showing a pressure distribution in the reduced pressure type MOCVD device.
Figure 11:
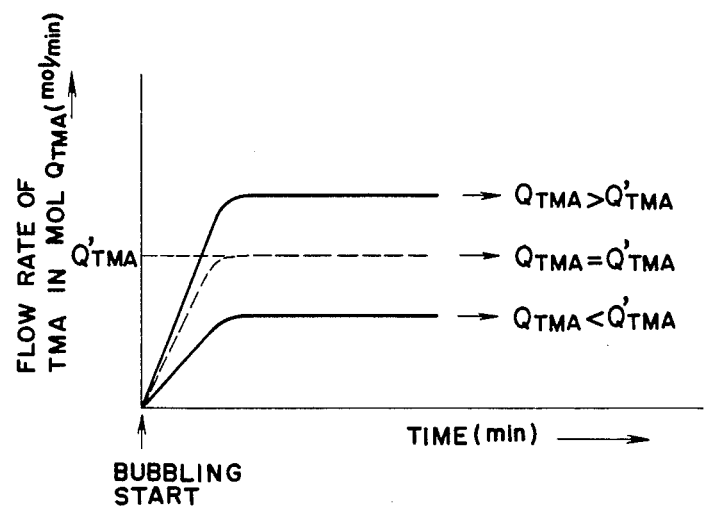
FIG. 11 shows graphs indicating variations in the flow rate of the organic metal (TMA) with the passage of time by the prior art reduced pressure type MOCVD method.

FIG. 1 is a block diagram illustrating the construction of a reduced MOCVD device provided with an apparatus for supplying metal organic gas according to this invention. In the figure, the reference numerals, which are used in common in FIG. 9, represent items identical or corresponding to those indicated in FIG. 9; 12 represents a pressure sensor; 13 a comparator; and 14 a reference signal generator.

The device indicated in FIG. 1 differs from the prior art system in that there are disposed a pressure sensor 12 outputting electric signals, a comparator 13 and a reference pressure signal generator 14 and that in addition the pressure difference generator 11 is an electrically driven pressure difference valve.

The apparatus indicated in FIG. 1 works as follows.

Carrier gas is introduced through the bypass valve 5, the flow path 7 and the electrically driven pressure difference valve 11 into the reactor 8. At this time the pressure within the bubbler 1 is monitored by means of the pressure sensor 12 and the pressure difference valve 11 is controlled so that this pressure is kept to be 1 atm (=760 Torr). The value of the output signal from the pressure sensor 12 after the flow has reached a stationary state is set as the reference pressure signal value. The output signal and the reference pressure signal are inputted in the comparator 13. The comparator 13 sends an output signal to the pressure difference valve 11 so that the difference between the two signals is zero. The electrically driven valve 11 is controlled by this output signal and thus the conductance of the valve is increased or decreased. For example, if the output signal of the pressure sensor 12 exceeds the reference pressure value, the polarity of the output signal from the comparator 13 (the control signal for the electrically driven valve) may be set so as to increase the conductance of the electrically driven valve 11. On the contrary, if the output signal of the pressure sensor 12 is lower than the reference pressure value, the conductance of the valve 11 is decreased so that the indication value of the pressure sensor 12 is brought gradually closer to the reference pressure value.

Similarly, in the multi-layer growth of mixt crystal semiconductors described in the background of the invention, according to this invention, it is possible to decrease the variations in the pressure loss due to variations in the flow rate to zero. Consequently, since the bubbling pressure doesn't vary, the flow rate of the organic metal in mol $Q_{TMA}$ varies simply proportionally to the variations in $Q_c$, as it is clear from Eq. (1), which makes the control easier.

Figure 2:
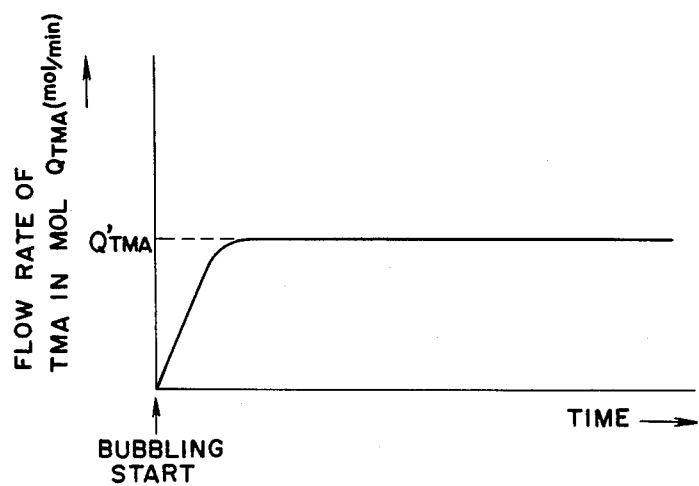
FIGS. 2 and 3 are graphs showing variations in $Q_{TMA}$ and the bubbler pressure before and after bubbling start, respectively.
Figure 3:
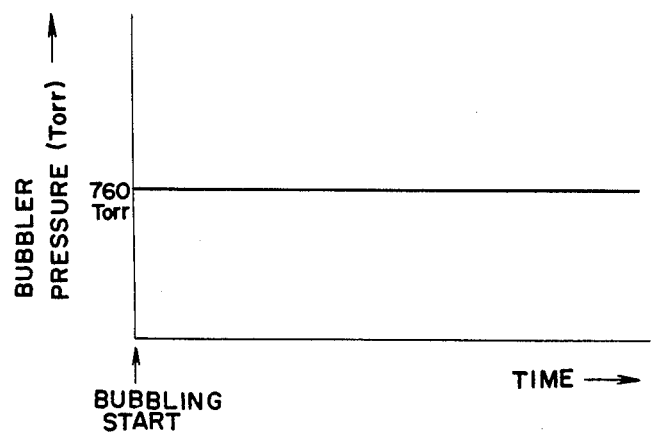
Figure 12:
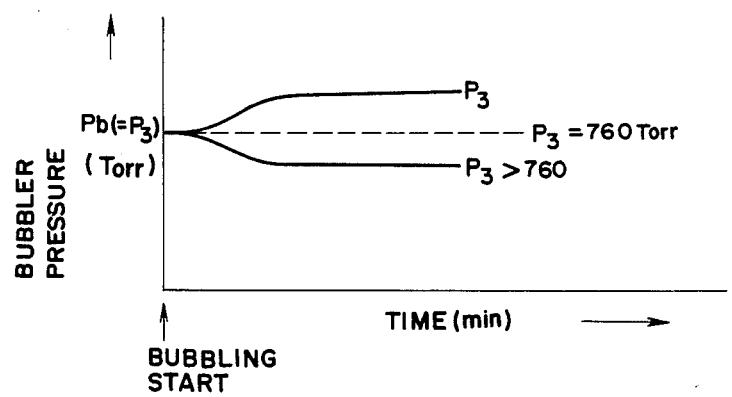
FIG. 12 shows graphs indicating variations in the pressure within the bubbler by the prior art reduced pressure type MOCVD method.

FIGS. 2 and 3 show an example of the control of the flow rate of TMA in mol according to this invention. $Q_{TMA}$ is exactly equal to the set value $Q'_{TMA}$ in spite of variations in the quality of the gas accompanying the bubbling of TMA (FIG. 2). Further the bubbler pressure hardly differs before and after the bubbling start, contrarily to the case indicated in FIG. 12. Thus it is possible to stabilize the flow rate of the organic gas (TMA) in mol by monitoring the bubbler pressure to control the pressure difference generator portion.

Figure 4:
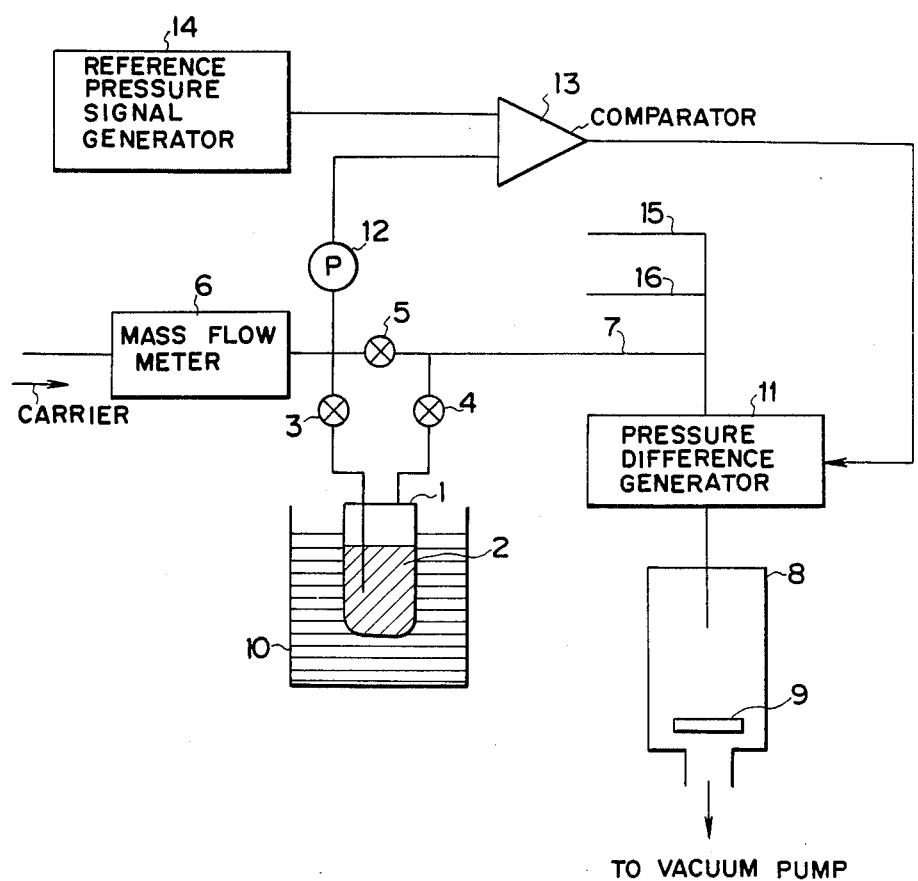
FIG. 4 is a block diagram illustrating the construction of another apparatus for realizing the method for supplying metal organic gas according to this invention.

FIG. 4 is a block diagram illustrating the construction of another apparatus for realizing the method for supplying metal organic gas according to this invention. In the figure, the reference numerals, which are used in common in FIG. 1, represent items identical or corresponding to those indicated in FIG. 1; 15 represents a flow path for gas A; and 16 a flow path for gas B.

As indicated in FIG. 4, also in the case where there exist other gas lines using a pressure difference generator portion in common with the metal organic gas line, it is possible to stabilize the metal organic gas supply. In this apparatus, other gas lines 15 and 16 are connected with the metal organic gas line on the upper stream side of the pressure difference generator portion 11, i.e. at a position closer to the bubbler 1. When the pressure varies in a flow path 15 or 16, according to the prior art method, the pressure within the bubbler 1 varies. If the control method according to this invention were not used, it would be impossible to avoid variations in the bubbler pressure provoked by other gas lines, which makes a stable metal organic gas supply impossible.

On the contrary, by the control method according to this invention, by which the pressure difference generator portion 11 is controlled, the pressure within the bubbler 1 is stabilized by the same effect as that described for the case of a simple gas and as the result the supplied amount of the organic metal is also stabilized.

Figure 5:
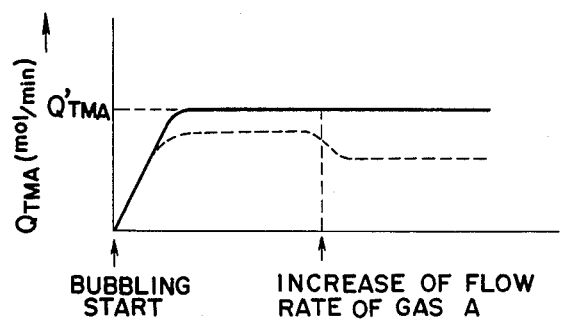
FIGS. 5 and 6 are graphs showing variations in $Q_{TMA}$ and the bubbler pressure before and after bubbling start, respectively, obtained by using the apparatus indicated in FIG. 4. according to this invention and according to a prior art method.
Figure 6:
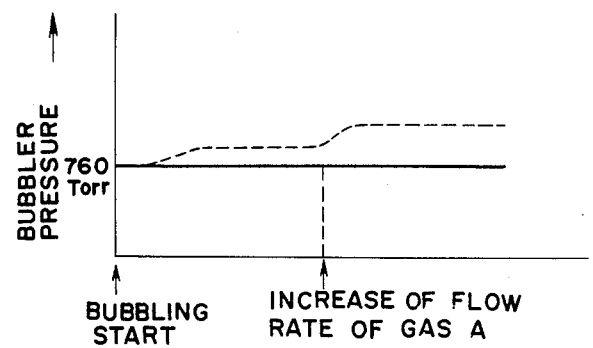
Figure 7:
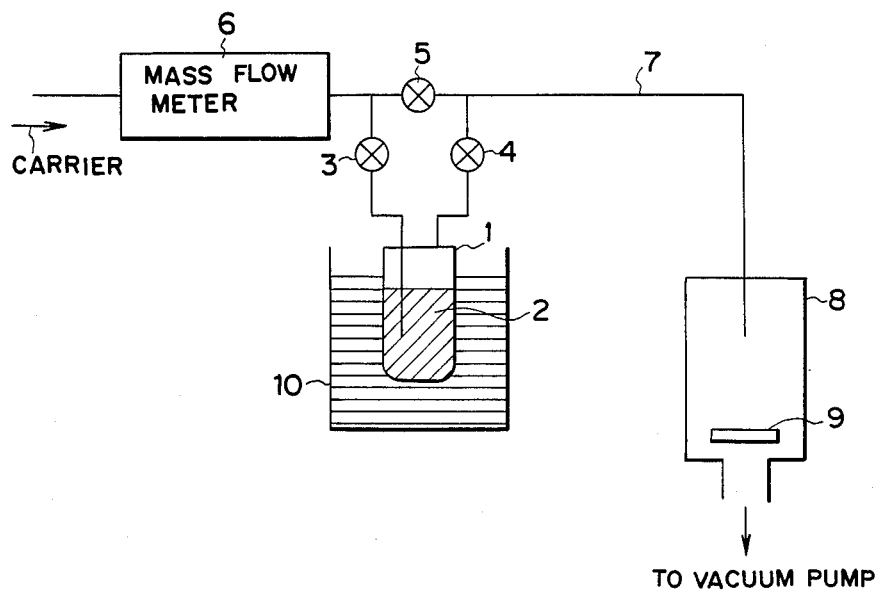
FIG. 7 is a block diagram illustrating the construction of a portion for supplying metal organic gas in an atmospheric pressure type MOCVD device.
Figure 8:
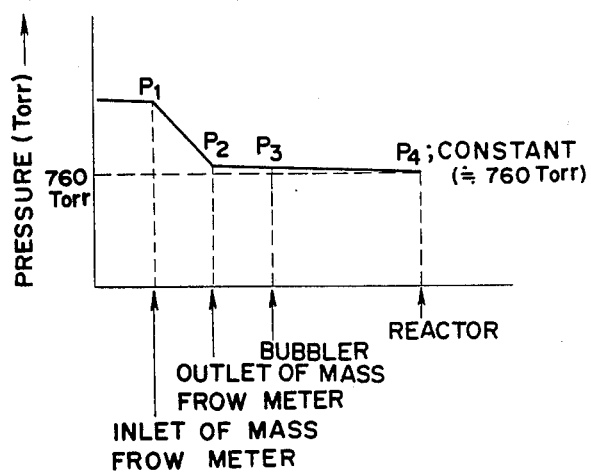
FIG. 8 is a graph showing a pressure distribution in the atmospheric pressure type MOCVD device.

FIGS. 5 and 6 show variations in the flow rate of TMA in mol and variations in the bubbler pressure, respectively, with the passage of time, when gas A and gas B are connected thereto, in the case where this invention is applied thereto (full line) and in the case where it is not applied thereto (broken line) for comparison.

As explained above, according to this invention, the flow rate of the metal organic gas is not influenced by variations in the quality of the gas in the whole before and after the bubbling start and thus it is possible to supply it stably. Further variations in the bubbler pressure due to variations in the flow rate of the carrier gas during the bubbling of the metal organic gas and consequently the flow rate of the metal organic gas is simply proportional to the flow rate of the carrier gas. Furthermore also in the case where there exist other gas lines connected with the metal organic gas line and these gas lines use a pressure difference generator portion in common with the metal organic gas line, advantages can be obtained in that it is possible to avoid the variations in the bubbler pressure difference generator portion in common with the metal organic gas line, advantages can be obtained that it is possible to avoid the variations in the bubble pressure due to the variations in the quality and the flow rate of mixture gas and to supply stably the metal organic gas.

While particular embodiments of the invention have been shown and described, it will be obvious to those skilled in the art that various changes and modifications may be made without departing from the present invention in its broader aspect.

The embodiments of this invention in which an exclusive property or privilege is claimed are defined as follows:

1. In a reduced pressure gaseous phase thin film growth apparatus, in which an organo-metallic compound gas is supplied from a carrier gas passed through a bubbler containing an organo-metallic compound and thereafter passed through a pressure difference generator to a reactor, the improvement wherein said apparatus comprises:
    a pressure sensor for detecting the pressure within said bubbler and providing an output signal indicative of said pressure;
    reference pressure signal generator means for producing an output signal indicative of a chosen reference pressure;
    a comparator for comparing the output signal of said pressure sensor with the reference pressure signal outputted by said reference pressure signal generator means and producing an output signal indicative of a pressure difference therebetween; and
    control means for controlling said pressure difference generator, responding to said output signal of said comparator so that the pressure within said bubbler is kept to be constant.

2. A reduced pressure gaseous phase thin film growth device according to claim 1, wherein said pressure difference generator is an electrically driven pressure difference valve.

3. A reduced pressure gaseous phase thin film growth device according to claim 1, wherein said organo-metallic compound is trimethylaluminium.

4. In a reduced pressure gaseous phase thin film growth method, in which an organo-metallic compound gas is supplied from a carrier gas passed through a bubbler containing an organo-metallic compound and thereafter passed through a pressure difference generator to a reactor, the improvement wherein said method comprises;
    the step of detecting the pressure within said bubbler; and
    the step of controlling said pressure difference generator responsively to the value of the pressure thus detected, so that the pressure within said bubbler is kept constant.

5. The reduced pressure gaseous phase thin film growth device of claim 1 further including means for supplying said carrier gas at a chosen fixed mass flow rate to said bubbler.

6. The method of claim 4 wherein said carrier gas is introduced into said bubbler at a chosen fixed mass flow rate.

* * * * *